United States Patent
Lin et al.

(10) Patent No.: US 9,947,403 B1
(45) Date of Patent: Apr. 17, 2018

(54) METHOD FOR OPERATING NON-VOLATILE MEMORY DEVICE AND APPLICATIONS THEREOF

(71) Applicant: MACRONIX INTERNATIONAL CO., LTD., Hsinchu (TW)

(72) Inventors: Yu-Yu Lin, New Taipei (TW);
Feng-Min Lee, Hsinchu (TW);
Kai-Chieh Hsu, Taoyuan (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/469,672

(22) Filed: Mar. 27, 2017

(51) Int. Cl.
*G11C 13/00* (2006.01)

(52) U.S. Cl.
CPC ...... *G11C 13/0069* (2013.01); *G11C 13/0064* (2013.01)

(58) Field of Classification Search
CPC .................. G11C 13/0069; G11C 13/0064
See application file for complete search history.

(56) References Cited

U.S. PATENT DOCUMENTS

| | | | |
|---|---|---|---|
| 5,745,410 A | 4/1998 | Yiu et al. | |
| 8,446,758 B2 | 5/2013 | Chen | |
| 8,902,629 B2 | 12/2014 | Kawai et al. | |
| 9,208,874 B2 | 12/2015 | Lee et al. | |
| 9,251,893 B2 | 2/2016 | Chung | |
| 2013/0094275 A1* | 4/2013 | Chen | G11C 11/00 365/148 |
| 2013/0094276 A1* | 4/2013 | Torsi | G11C 13/0004 365/148 |
| 2014/0050011 A1* | 2/2014 | Sone | G11C 13/0069 365/148 |
| 2015/0036426 A1 | 2/2015 | Kwak et al. | |
| 2016/0006408 A1 | 1/2016 | Murata | |

OTHER PUBLICATIONS

Fantini, et al.: "Intrinsic Program Instability in HfO2 RRAM and consequences on program algorithms"; 978-1-4673-9894-7/15/$31.00 © 2015 IEEE; pp. 7.5.1-7.5.4.
Degraeve, et al.: "Quantitative model for post-program instabilities in filamentary RRAM"; University of Pavia Via Ferrata 5 27100 Pavia, Italy; 978-1-4673-9137-5/16/$31.00 © 2016 IEEE; pp. 1-7.

* cited by examiner

*Primary Examiner* — Tri Hoang
(74) *Attorney, Agent, or Firm* — McClure, Qualey & Rodack, LLP

(57) ABSTRACT

A method for operating a resistance switching memory device is provided, wherein the method includes a first program process, and the first program process includes steps as follows: A programming pulse having a first polarity is firstly applied to at least one resistance switching memory cell of the NVM device. A first verifying pulse with a verifying voltage is then applied to the resistance switching memory cell. A first settling pulse is applied to the resistance switching memory cell prior to or after the verifying pulse is applied, wherein the first settling pulse includes a settling voltage having a second polarity opposite to the first polarity and an absolute value substantially less than that of the verifying voltage.

13 Claims, 14 Drawing Sheets

METHOD FOR OPERATING NON-VOLATILE MEMORY DEVICE AND APPLICATIONS THEREOF

FIELD

The invention relates in general to a method for operating a non-volatile memory (NVM) device and the application thereof, and more particularly to a method for operating a memory device with at least one resistance switching memory cell and the application thereof.

BACKGROUND

An NVM which is able to continually store information even when the supply of electricity is removed from the device containing the NVM cells. Recently, the most widespread used NVMs are charge trap flash (CTF) memory devices. However, as semiconductor features shrink in size and pitch, the CTF memory devices have its physical limitation of operation. In order to solve the problems, a resistance switching memory device, such as a resistive random-access memory (ReRAM) device is thus provided.

ReRAM devices that apply difference of resistance within the resistance switching memory cells thereof to implementing the erase/program operation have advantages in terms of cell area, device density, power consumption, programming/erasing speed, and the like over other FLASH memory devices, and thus have become a most promising candidate for leading products in the future memory market.

The programming of a ReRAM device typically includes steps as follows: A programming pulse is first applied to at least one resistance switching memory cell selected from the ReRAM device to make the resistance distribution state of the resistance switching memory cell shift from a first resistance distribution state (e.g. a low resistance distribution state) to a second resistance distribution state (e.g. a high resistance distribution state). A verification process is then performed to determine whether the resistance distribution state of the resistance switching memory cell has shift to the second resistance distribution state. In order to implement the verification process, a proper resistance window for identifying the two different resistance distribution states is required.

Therefore, there is a need of providing an improved method for operating an NVM device for identifying the two different resistance distribution states with a proper resistance window.

SUMMARY

According to one embodiment of the present disclosure, a method for operating an NVM device is provided, wherein the method includes a first program process, and the first program process includes steps as follows: A programming pulse having a first polarity is firstly applied to at least one resistance switching memory cell of the NVM device. A first verifying pulse with a verifying voltage is then applied to the resistance switching memory cell. A first settling pulse is applied to the resistance switching memory cell before or after applying the verifying pulse, wherein the first settling pulse includes a settling voltage having a second polarity opposite to the first polarity and an absolute value substantially less than that of the verifying voltage.

According to another embodiment of the present disclosure, an NVM device is provided, wherein the NVM device includes at least one resistance switching memory cell and a controller electrically connected to the resistance switching memory cell for performing a first programming process, wherein the first program process includes steps as follows: A programming pulse having a first polarity is firstly applied to the resistance switching memory cell of the NVM device. A first verifying pulse with a verifying voltage is then applied to the resistance switching memory cell. A first settling pulse is applied to the resistance switching memory cell before or after applying the verifying pulse, wherein the first settling pulse includes a settling voltage having a second polarity opposite to the first polarity and an absolute value substantially less than that of the verifying voltage.

According to yet another embodiment of the present disclosure, a method for fabricating a NVM device is provided, wherein the method includes steps as follows: At least one resistance switching memory cell is firstly formed. A controller is then formed to electrically connecting the resistance switching memory cell and used to perform a first program process, wherein the first program process comprises steps as follows: A first programming pulse having a first polarity (+) is firstly applied to of the NVM device. A first verifying pulse with a verifying voltage (Vver) is then applied to the resistance switching memory cell. Subsequently, a first settling pulse is applied before or after applying the verifying pulse, wherein the first settling pulse comprises a settling voltage (Vset) having a second polarity (−) opposite to the first polarity and an absolute value substantially less than or equal to that of the verifying voltage (|Vset| |Vver|).

In accordance with the aforementioned embodiments of the present invention, a method for operating an NVM device and the application thereof are provided. A programming pulse and a verifying pulse are applied to at least one resistance switching memory cell of the NVM device during a program process of the NVM device, and a settling pulse is applied to the resistance switching memory cell before or after applying the verifying pulse, wherein the settling pulse and the verifying pulse have opposite polarities; and the settling pulse has a settling voltage with an absolute value substantially less than the voltage of the verifying pulse. The resistance of the resistance switching memory cell can be greater than a predetermined level after the program process, and the resistance distribution state of the resistance switching memory cell may not revert back to a broader distribution with an undesirable tail of which the resistance is less than the predetermined level after a time interval pass by. Such that, the problems resulted from the intrinsic program instability of the resistance switching memory cell can be moderated.

BRIEF DESCRIPTION OF THE DRAWINGS

The above and other aspects of the invention will become better understood with regard to the following detailed description of the preferred but non-limiting embodiment (s). The following description is made with reference to the accompanying drawings.

FIG. 7A is a diagram illustrating the resistance cumulative distribution function (CDF) of the resistance switching memory cell of the NVM device on which the method and the program process as depicted in FIG. 5A and FIG. 5B are performed, after the certain time interval pass by;

FIG. 7B is a diagram illustrating the resistance CDF of the resistance switching memory cell of the NVM device on which a program process provided by a comparison example is performed, after the certain time interval pass by;

FIG. 8A is a diagram illustrating the resistance CDF of the resistance switching memory cell of the NVM device on which the method and the program process as depicted in FIG. 6A and FIG. 6B are performed, after the certain time interval pass by;

FIG. 8B is a diagram illustrating the resistance CDF of the resistance switching memory cell of the NVM device on which a program process provided by another comparison example is performed, after the certain time interval pass by;

DETAILED DESCRIPTION OF THE INVENTION

Figure 1:
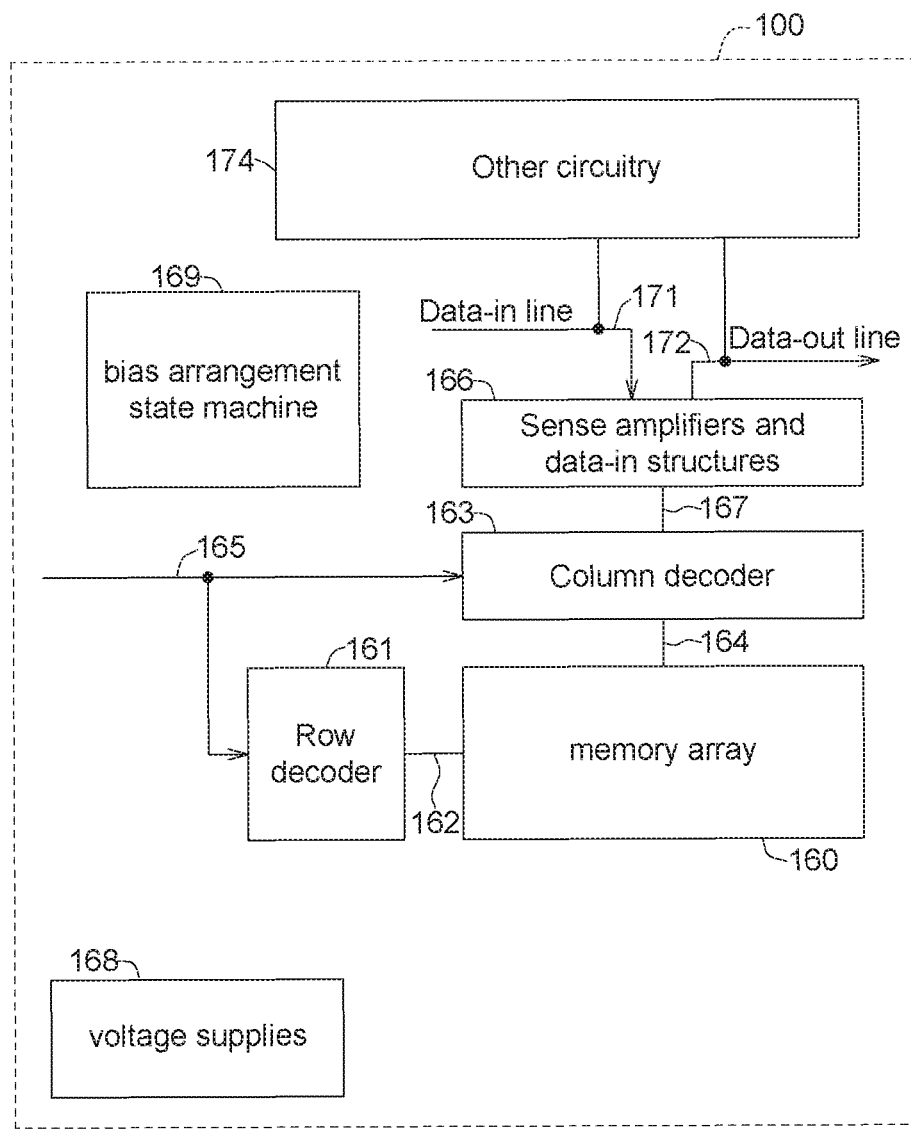
FIG. 1 is a block diagram illustrating an integrated circuit of an NVM device in accordance with one embodiment of the present disclosure.

Embodiments of this disclosure include a method for operating an NVM device and the application thereof may resolve the problems resulted from the intrinsic program instability of the NVM device. A number of embodiments of the present disclosure are disclosed below with reference to the accompanying drawings. However, the structure and content disclosed in the embodiments are for exemplary and explanatory purposes only, and the scope of protection of the present disclosure is not limited to the embodiments. Designations common to the accompanying drawings and embodiments are used to indicate identical or similar elements. It should be noted that the present disclosure does not illustrate all possible embodiments, and anyone skilled in the technology field of the disclosure will be able to make suitable modifications or changes based on the specification disclosed below to meet actual needs without breaching the spirit of the disclosure. The present disclosure is applicable to other implementations not disclosed in the specification. In addition, the drawings are simplified such that the content of the embodiments can be clearly described, and the shapes, sizes and scales of elements are schematically shown in the drawings for explanatory and exemplary purposes only, not for limiting the scope of protection of the present disclosure.

Figure 10:
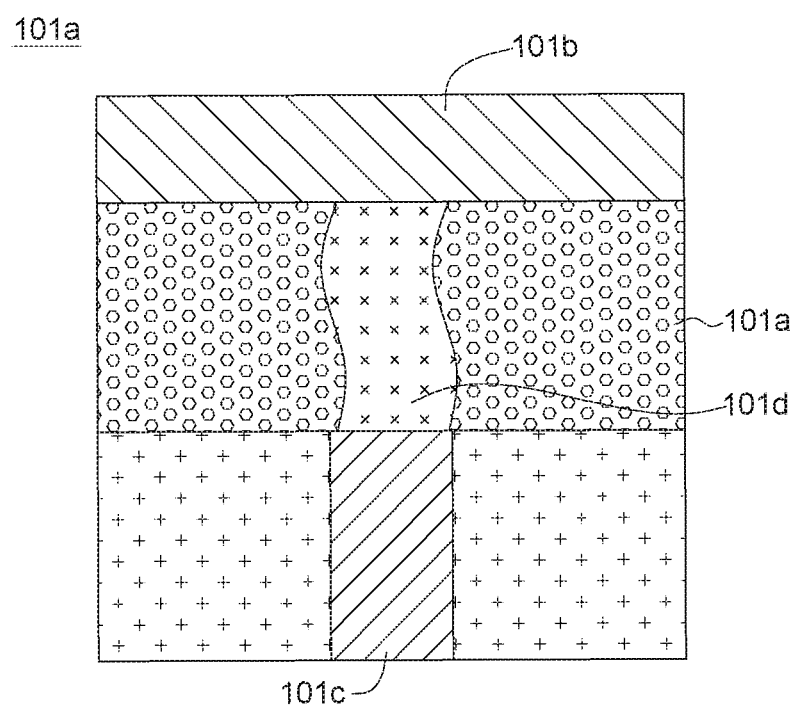
FIG. 10 is a cross-sectional view illustrating a resistance switching memory cell of a ReRAM, in accordance with one embodiment of the preset disclosure.

FIG. 1 is a block diagram illustrating an integrated circuit of an NVM device 100 in accordance with one embodiment of the present disclosure. In some embodiments of the present disclosure, the NVM device 100 may be a memory device having a plurality of resistance switching memory cells 101. For example, the NVM device 100 may be a ReRAM including a memory array 160 formed by a plurality of resistance switching memory cells 101 configured on an integrated circuit (IC). Each resistance switching memory cell (as shown in FIG. 10) includes a resistance switching layer 101a between a first electrode 101b and a second electrode 101c. The resistance switching layer 101a includes a high-K dielectric material, a binary metal oxide or a transition metal oxide. The first electrode 101b and the second electrode 101c may include a conductive material comprising Si, W, TiN, TaN, Ta, Cu or other suitable materials.

In the present embodiment, the NVM device 100 includes elements as set forth below: A row decoder 161 is coupled to a plurality of word lines 162, and arranged along rows in the memory array 160. A column decoder 163 is coupled to a plurality of bit line conductors 164 arranged along columns in the memory array 160 for reading and programming data from the resistance switching memory cells 101 in the memory array 160. Addresses are supplied on bus 165 to column decoder 163, row decoder 161 and plane decoder 158. Sense amplifiers and data-in structures 166 are coupled to the column decoder 163 in this example via data bus 167. Data is supplied via the data-in line 171 from input/output ports on the NVM device 100 or from other data sources internal or external to the NVM device 100, to the data-in structures 166. In the illustrated embodiment, other circuitry 174 is included on the integrated circuit, such as a general purpose processor or special purpose application circuitry, or a combination of modules providing system-on-a-chip functionality supported by the NVM memory cell array. Data is supplied via the data-out line 172 from the sense amplifiers in block 166 to input/output ports on the NVM device 100, or to other data destinations internal or external to the NVM device 100.

The NVM device 100 further comprises a controller electrically connected to the resistance switching memory cells 101 of the memory array 160. In some embodiment of the present disclosure, the controller may be implemented using bias arrangement state machine 169 to control the application of bias arrangement supply voltage generated or provided through the voltage supply or supplies 168, such as read, program, and program verify voltages. In some other embodiments, the controller can be implemented using special-purpose logic circuitry as known in the art. In alternative embodiments, the controller may include a general-purpose processor, which may be implemented on the same integrated circuit, which executes a computer program to control the operations of the NVM device 100. In yet other embodiments, a combination of special-purpose logic circuitry and a general-purpose processor may be utilized for implementation of the controller.

In some embodiments, the NVM device 100 may be a ReRAM having various operations for data storage. In a "forming" operation, a "forming" voltage is applied to the first electrode 101*b* and the second electrode 101*c* of the resistance switching memory cells 101. The "forming" voltage is high enough to generate a conductive portion 101*d* in the resistance switching layer 101*a* (see FIG. 10). In one example, the conductive portion includes one or more conductive filaments to provide a conductive path such that the resistance switching layer 101*a* shows an "on" or low resistance state. The conductive path may be related to the lineup of the defect (e.g. oxygen) vacancies in the resistance switching layer 101*a*. In some embodiments, the "forming" voltage is applied only one time. Once the conductive path is formed, the conductive path will remain present in the resistance switching layer.

After the "forming operation", program operations may disconnect or reconnect the conductive path using smaller voltages or different voltages. The program operations may include a "set" operation or a "reset" operation.

In a "set" operation, a "set" voltage high enough to reconnect the conductive path in the resistance switching layer is applied to the resistance switching memory cell such that the resistance switching layer shows the "on" or low resistance state.

In a "reset" operation, a "reset" voltage high enough to break the conductive path in the resistance switching layer is applied to the resistance switching memory cell such that the resistance switching layer shows an "off" or high resistance state. By applying a specific voltage between two electrodes, an electric resistance of the resistance switching layer is altered after applying the specific voltage. The low and high resistances are utilized to indicate a digital signal "1" or "0", thereby allowing for data storage.

Figure 2A:
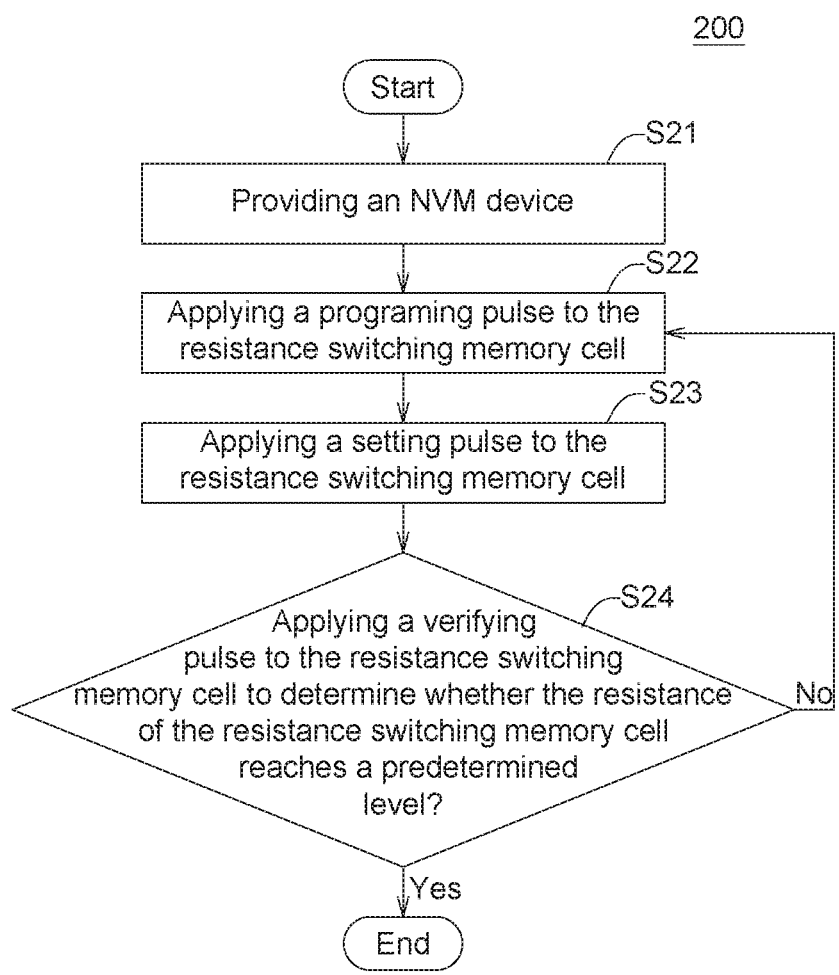
FIG. 2A is a process flow diagram illustrating a method for operating an NVM device in accordance with one embodiment of the present disclosure.
Figure 2B:
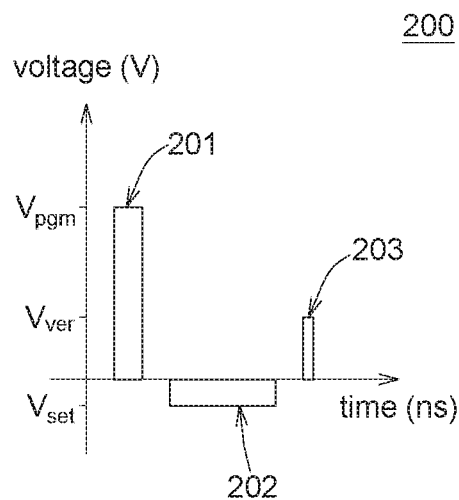
FIG. 2B is a timing diagram of a programming operation using the method depicted in FIG. 2A in accordance with one embodiment of the present disclosure.

FIG. 2A is a process flow diagram illustrating a method for operating the NVM device 100 of ReRAM in accordance with one embodiment of the present disclosure. FIG. 2B is a timing diagram of a program process 200 using the method depicted in FIG. 2A in accordance with one embodiment of the present disclosure. In some embodiments of the present disclosure, the program process 200 of the NVM device 100 includes steps as follows: Firstly, an NVM device, such as the NVM device 100 depicted in FIG. 1, is provided (see step S21).

A programming pulse 201 with a first polarity is then applied to at least one of the resistance switching memory cells 101 of the NVM device 100 (see step S22). For example, in the present embodiment, the programming pulse 201 may have a positive programming voltage $V_{pgm}$ at about 1.6 V and a pulse width ranging from 500 nanoseconds (ns) to 3000 ns.

Next, a settling pulse 202 having a second polarity apposite to the first polarity is applied to the resistance switching memory cell 101 (see step S23). In some embodiments of the present disclosure, the settling pulse 202 has a negative settling voltage $V_{set}$ ranging from −0.3V to −1.0V and a pulse width ranging from 1 microsecond (μs) to 3 μs. The settling voltage $V_{set}$ of the settling pulse 202 has an absolute value substantially less than that of the programming voltage $V_{pgm}$ of the programming pulse 201 ($|V_{set}|<|V_{pgm}|$). In the present embodiment, the negative settling voltage $V_{set}$ of the settling pulse 202 is about −0.5V, and the pulse width of the settling pulse 202 is about 1 microsecond (μs).

Subsequently, a verifying pulse 203 having a verifying voltage $V_{ver}$ is applied to the resistance switching memory cell 101 (see step S24), to determine whether the resistance of the resistance switching memory cells 101 reaches a predetermined level. In some embodiments of the present disclosure, the verifying voltage $V_{ver}$ of the verifying pulse 203 has an absolute value substantially greater than or equal to the absolute value of the settling voltage $V_{set}$ of the settling pulse 202 ($|V_{set}|\leq|V_{ver}|$) and a pulse width far less than that of the settling pulse 202. For example, in the present embodiment, the verifying pulse 203 has a positive polarity; and the verifying voltage $V_{ver}$ of the verifying pulse 203 is about 0.5 V. The pulse width of the verifying pulse 203 ranges from 50 ns to 100 ns, and is about 80 ns in one example.

During the verification, when it is determined that the resistance switching memory cell 101 reaches the predetermined level (designated as "Yes"), the program process 200 is then terminated. Alternatively, when it is determined that the resistance switching memory cell 101 is less than the predetermined level (designated as "No"), the program process 200 may return to the step S22, and the steps S22, S23 as well as S24 are performed again. In other words, the resistance switching memory cell 101 may be subjected to another programming pulse 201 (in the step S22), another settling pulse 202 (in the step S23) and another verifying pulse 203 (in the step S24); and the loop of the steps S22, S23 and S24 may not be stopped until the resistance switching memory cell 101 reaches the predetermined level. In the present embodiment, the program process 200 is terminated after the resistance switching memory cell 101 is subjected to the verifying pulse 203 for the first time. It means that the resistance switching memory cell 101 is subjected to one programming pulse 201, one settling pulse 202 and one verifying pulse 203.

The resistance of the resistance switching memory cell 101 can be greater than a predetermined level after the program process 200, and the resistance distribution state of the resistance switching memory cell 101 may not revert back to a broader distribution with an undesirable tail of which the resistance is less than the predetermined level after a time interval. The problems resulted from the intrinsic program instability of the resistance switching memory cell may be moderated.

Figure 2C:
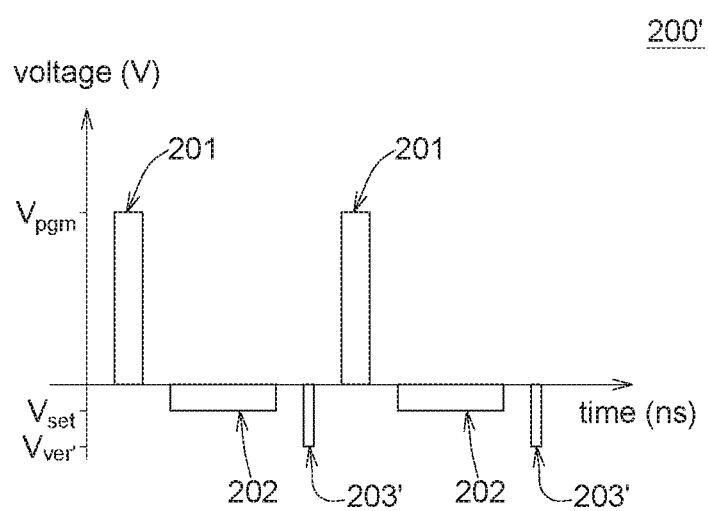
FIG. 2C is a timing diagram of a program process using the method depicted in FIG. 2A in accordance with another embodiment of the present disclosure.

In some embodiments, the verifying pulse 203 and the programming pulse 201 may have opposite polarities. For example, FIG. 2C is a timing diagram of a program process 200' using the method depicted in FIG. 2A in accordance with another embodiment of the present disclosure. The timing diagram of FIG. 2C is similar to that depicted in FIG. 2B, except that the verifying pulse 203' has a negative polarity that is opposite to the polarity of the programming pulse 201. In the present embodiment, the verifying voltage $V_{ver}'$ of the verifying pulse 203' is about −0.5 V. Since, the verifying pulse 203' has a pulse width far less than that of the settling pulse 202, thus the settling pulse 202 and the verifying pulse 203' depicted in the timing diagram of a program process 200' still can be distinguished from each other, nevertheless both of the settling pulse 202 and the verifying pulse 203' have polarities opposite to the polarity of the programming pulse 201 and absolute voltage values substantially less than that of the programming pulse 201.

Figure 3A:
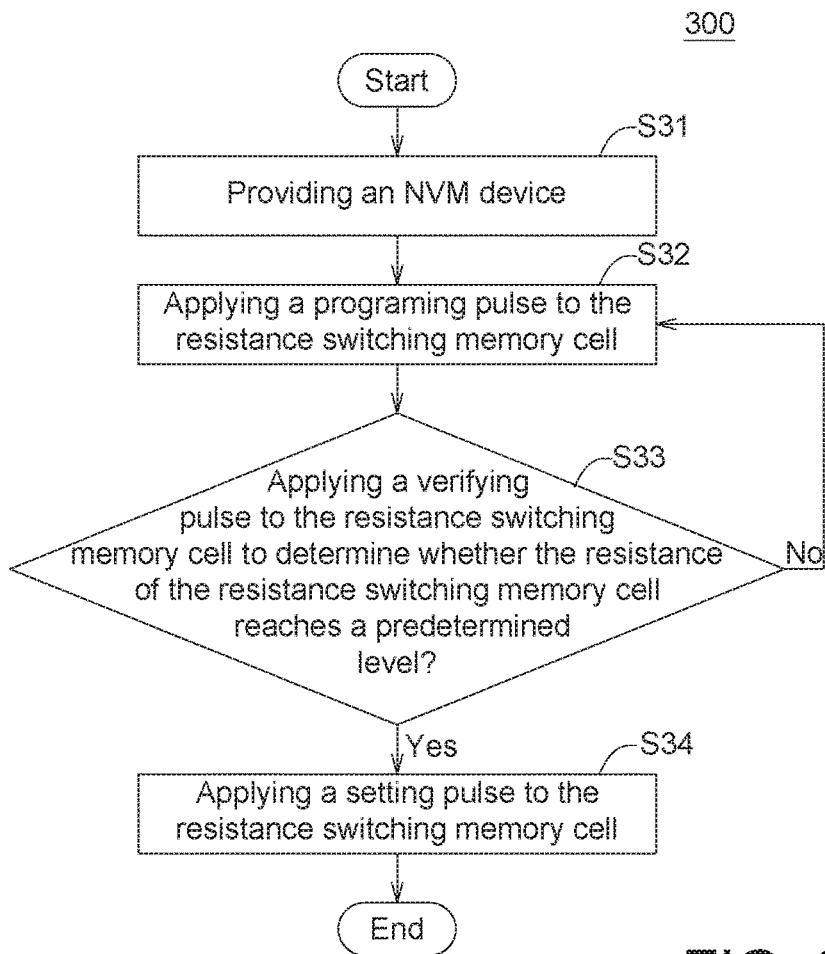
FIG. 3A is a process flow diagram illustrating a method for operating the NVM device in accordance with one embodiment of the present disclosure.
Figure 3B:
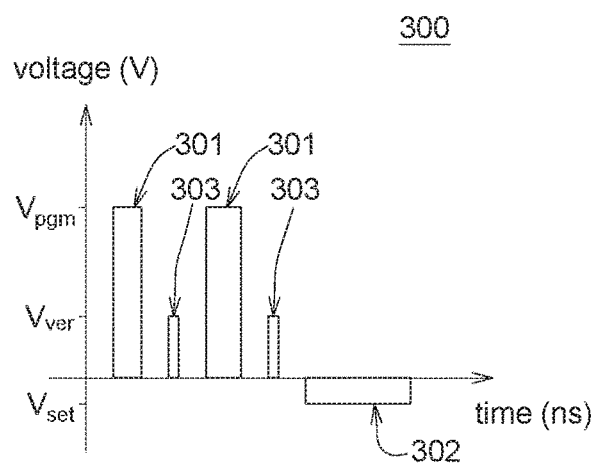
FIG. 3B is a timing diagram of a program process using the method depicted in FIG. 3A in accordance with one embodiment of the present disclosure.

FIG. 3A is a process flow diagram illustrating a method for operating the NVM device 100 in accordance with one embodiment of the present disclosure. FIG. 3B is a timing diagram of a program process 300 using the method depicted in FIG. 3A in accordance with one embodiment of the present disclosure. In some embodiments of the present disclosure, a program process 300 of the NVM device 100 includes steps as follows: Firstly, an NVM device, such as the NVM device 100 depicted in FIG. 1, is provided (see step S21).

A programming pulse 301 with a first polarity is then applied to at least one resistance switching memory cell 101 of the NVM device 100 (see step S32). For example, in the present embodiment, the programming pulse 301 may have a positive programming voltage $V_{pgm}$ at about 1.6 V and a pulse width ranging from 500 ns to 3000 ns.

Next, a verifying pulse 303 having a verifying voltage $V_{ver}$ is applied to the resistance switching memory cell 101 (see step S33), to determine whether the resistance of the resistance switching memory cell 101 reaches a predetermined level. In the present embodiment, the verifying pulse 303 includes a verifying voltage $V_{ver}$ (about 0.5 V) having a positive polarity; and the verifying voltage $V_{ver}$ is substantially less than the programming voltage $V_{pgm}$ of the programming pulse 301. The pulse width of the verifying pulse 303 ranges from 50 ns to 100 ns, and is about 80 ns in one example.

During the verification, when it is determined that the resistance switching memory cell 101 reaches the predetermined level (designated as "Yes"), the program process 300 proceeds to the step S34 in which a settling pulse 302 is applied to the resistance switching memory cell 101, and the program process 300 is then terminated. Alternatively, when it is determined that the resistance switching memory cell 101 is less than the predetermined level (designated as "No"), the program process 300 may return to the step S32, and the steps S32 and S33 are then performed again. The loop of the steps S32 and S33 may not be stopped until the resistance switching memory cell 101 reaches the predetermined level. After the loop is stopped, a settling pulse 302 is applied to the resistance switching memory cell 101 (see step S34), and the program process 300 is then terminated. The settling pulse 302 has a negative settling voltage $V_{set}$ opposite to the polarity of the programming voltage $V_{pgm}$ of the programming pulse 301. The settling voltage $V_{set}$ of the settling pulse 302 has an absolute value substantially less than or equal to that of the verifying voltage $V_{ver}$ ($|V_{set}| \leq |V_{ver}|$). The pulse width of the verifying pulse 303 is less than that of the settling pulse 302.

In the present embodiment, the loop of steps S32 and S33 is merely repeated one time after the resistance switching memory cell 101 is subjected to the verifying pulse 303 for the first time. Such that, the resistance switching memory cell 101 is subjected to two programming pulses 301, two settling pulse 302 twice and one single verifying pulse 303. The resistance of the resistance switching memory cell 101 can be greater than a predetermined level after the program process 300, and the resistance distribution state of the resistance switching memory cell 101 may not revert back to a broader distribution with an undesirable tail of which the resistance is less than the predetermined level after a time interval. The problems resulted from the intrinsic program instability of the resistance switching memory cell may be moderated.

Figure 4A:
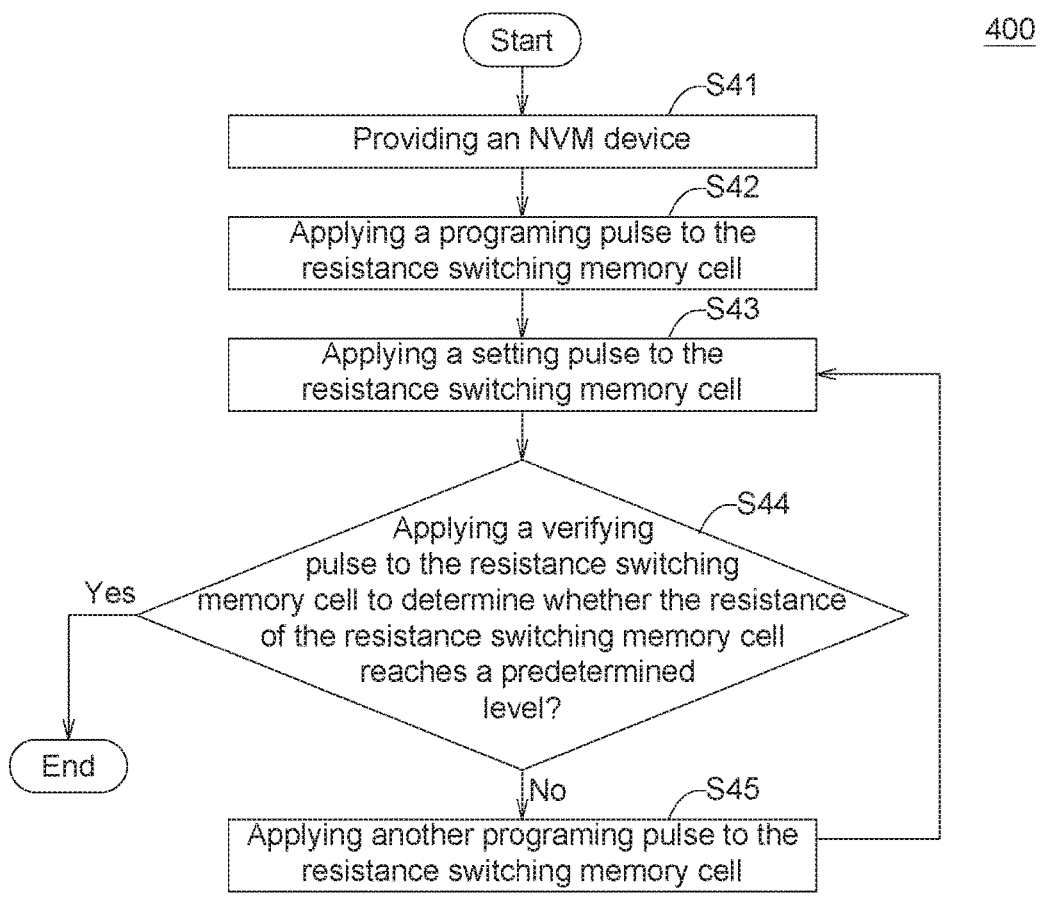
FIG. 4A is a process flow diagram illustrating a method for operating the NVM device in accordance with one embodiment of the present disclosure.
Figure 4B:
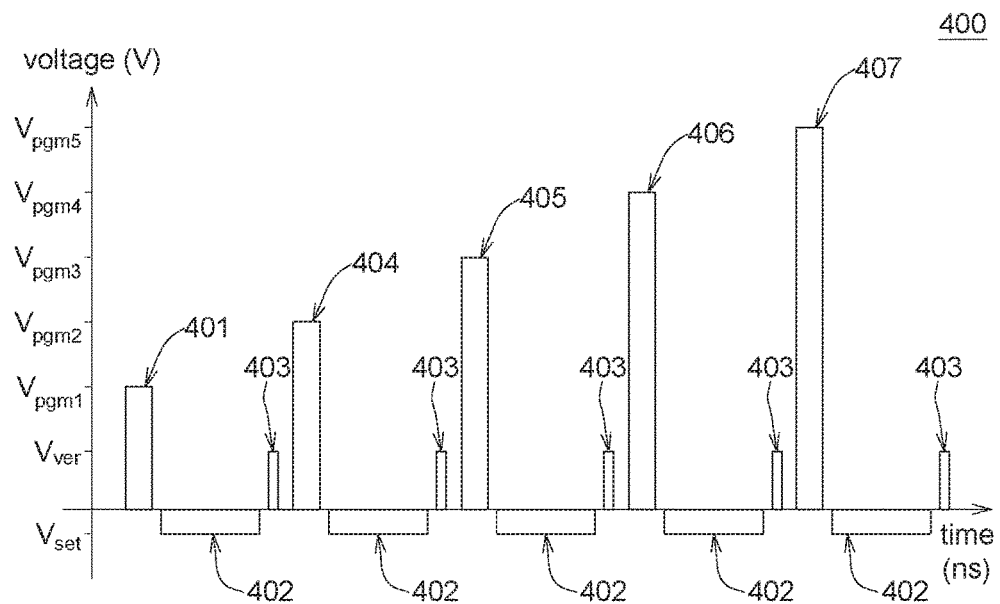
FIG. 4B is a timing diagram of a program process using the method depicted in FIG. 4A in accordance with one embodiment of the present disclosure.

FIG. 4A is a process flow diagram illustrating a method for operating the NVM device 100 in accordance with one embodiment of the present disclosure. FIG. 4B is a timing diagram of a program process 400 using the method depicted in FIG. 4A in accordance with one embodiment of the present disclosure. In some embodiments of the present disclosure, the program process 400 of the NVM device 100 includes steps as follows: Firstly, an NVM device, such as the NVM device 100 depicted in FIG. 1, is provided (see step S41).

A programming pulse 401 with a first polarity is then applied to at least one resistance switching memory cell 101 of the NVM device 100 (see step S42). For example, in the present embodiment, the programming pulse 401 may have a positive programming voltage $V_{pgm1}$ at about 1.6 V and a pulse width ranging from 500 ns to 3000 ns.

Next, a settling pulse 402 having a second polarity opposite to the first polarity is applied to the resistance switching memory cell 101 (see step S43). For example, the settling pulse 402 has a negative settling voltage $V_{set}$ ranging from −0.3V to −1.0V and a pulse width ranging from 1 μs to 3 μs. The settling voltage $V_{set}$ of the settling pulse 402 has an absolute value substantially less than that of the programming voltage $V_{pgm1}$ of the programming pulse 401 ($|V_{set}| < |V_{pgm1}|$). In the present embodiment, the negative settling voltage $V_{set}$ of the settling pulse 402 is about −0.5V, and the pulse width of the settling pulse 402 is about 1 μs.

Subsequently, a verifying pulse 403 having a verifying voltage $V_{ver}$ is applied to the resistance switching memory cell 101 (see step S44), to determine whether the resistance of the resistance switching memory cell 101 reaches a predetermined level. The program process 400 is terminated while the resistance of the resistance switching memory cell 101 reaches the predetermined level (designated as "YES"). In some embodiments of the present disclosure, the verifying pulse 403 has a verifying voltage $V_{ver}$ having an absolute value substantially greater than or equal to that of the settling voltage $V_{set}$ of the settling pulse 402 ($|V_{ver}| \geq |V_{set}|$). The pulse width of the verifying pulse 403 is far less than that of the settling pulse 402. In the present embodiment, the verifying pulse 403 has a positive verifying voltage $V_{ver}$ (about 0.5 V); and the pulse width of the verifying pulse 403 ranges from 50 ns to 100 ns.

In step S44, when it is alternatively determined that the resistance switching memory cell 101 is less than the predetermined level (designated as "NO"), the program process 400 proceed to the step S45 in which another programming pulse (such as a programming pulse 404) having the first polarity is applied to the resistance switching memory cell 101. In the present embodiment, the programming pulse 404 has a programming voltage $V_{pgm2}$ substantially greater than the programming voltage $V_{pgm1}$ of the programming pulse 401. Thereafter, the steps S43 and S44 are performed again to apply the settling pulse 402 and the verifying pulse 403 to the resistance switching memory cell 101; and the loop of the steps S45-S43 and S44 may not be stopped until the resistance switching memory cell 101 reaches the predetermined level.

In the present embodiment, the loop of steps S45, S43 and S44 is repeated 4 times after the resistance switching memory cell 101 is subjected to the verifying pulse 403 for the first time. Such that, the resistance switching memory cell 101 is subjected to five programming pulses 401, 404, 405, 406 and 407, five settling pulses 402 and five verifying pulses 403 (see FIG. 4B). The program voltages $V_{pgm2}$, $V_{pgm3}$, $V_{pgm4}$ and $V_{pgm5}$ of the programming pulse 404, 405, 406 and 407 provided by the step S45 are greater than the programming voltage $V_{pgm1}$ of the programming pulse 401. The program voltages $V_{pgm1}$, $V_{pgm2}$, $V_{pgm3}$, $V_{pgm4}$ and $V_{pgm5}$ are sequentially increased.

Figure 4C:
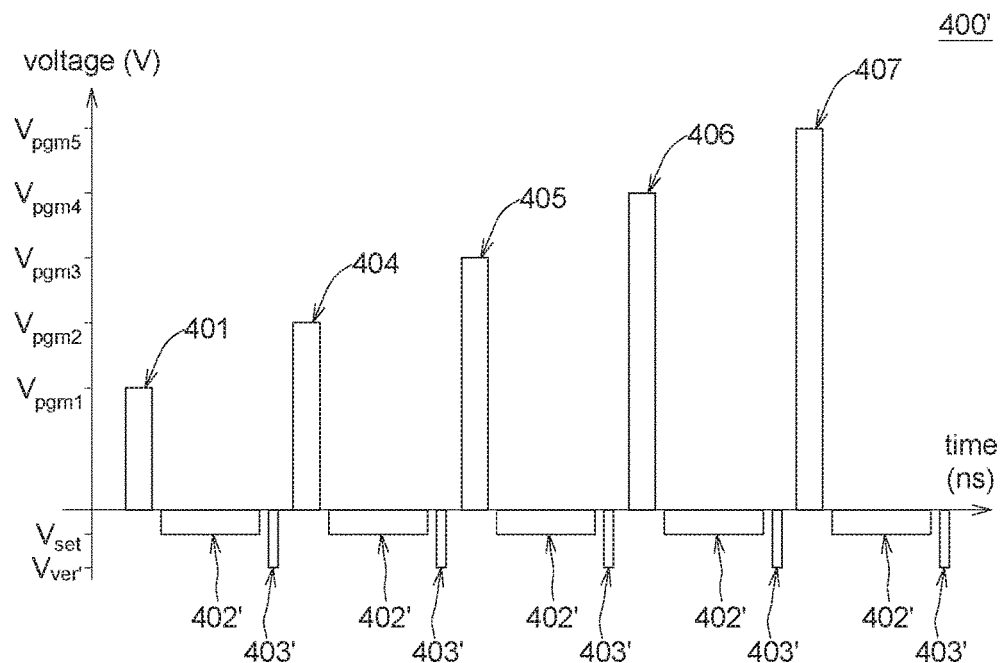
FIG. 4C is a timing diagram of a program process using the method depicted in FIG. 4A in accordance with another embodiment of the present disclosure.

Of note, the verifying pulse 403' and the settling pulse 402' can be integrated with each other to form an integrated pulse 408, when the verifying pulse 403' and the settling pulse 402' have the same polarity (i.e. both have a negative polarity). FIG. 4C is a timing diagram of a program process 400' using the method depicted in FIG. 4A in accordance with another embodiment of the present disclosure. The timing diagram of the program process 400' depicted in FIG. 4C is similar to that of the program process 400 depicted in FIG. 4B, except that the verifying pulse 403' applied by the program process 400' has a verifying voltage $V_{ver'}$ with a negative polarity opposite to the polarity of the programming voltage $V_{pgm1}$ of the programming pulse 401. The negative verifying voltage $V_{ver'}$ of the verifying pulse 403' is less than the negative settling voltage $V_{set}$ of the settling pulse 402', and there is no time interval inserted between the settling pulse 402' and the verifying pulse 403', whereby the integrated pulse 408 may be depicted as a continuous zigzag-shaped line as shown in the timing diagram of FIG. 4C.

Figure 5A:
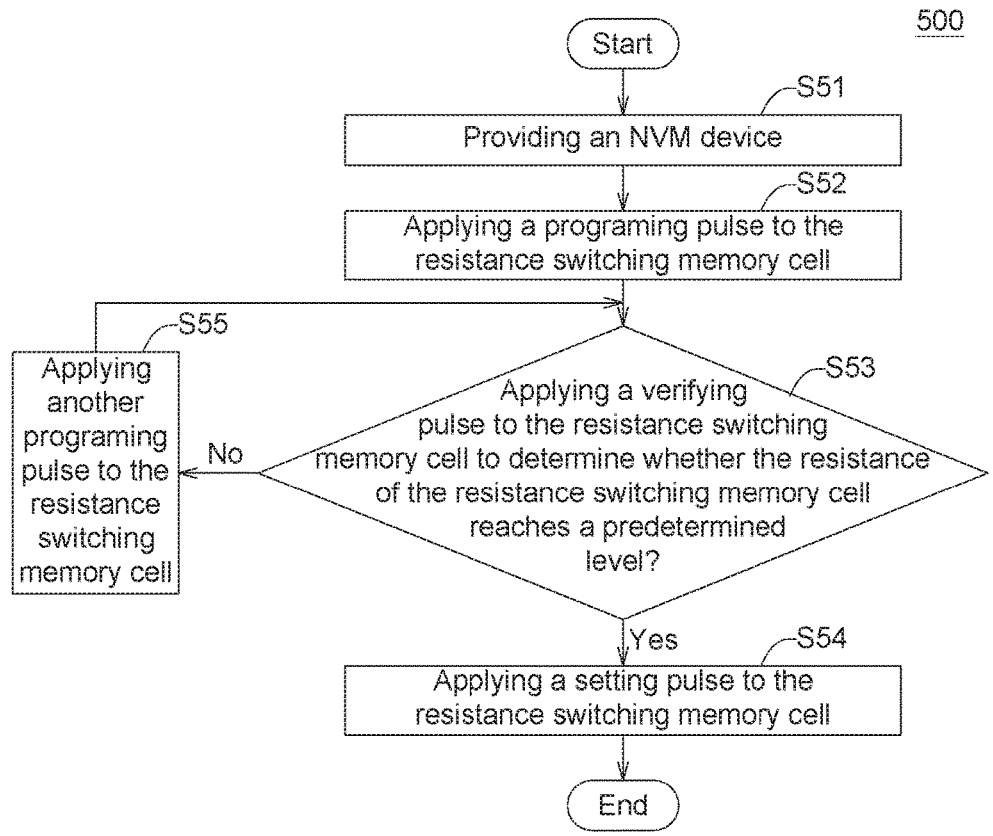
FIG. 5A is a process flow diagram illustrating a method for operating the NVM device in accordance with one embodiment of the present disclosure.
Figure 5B:
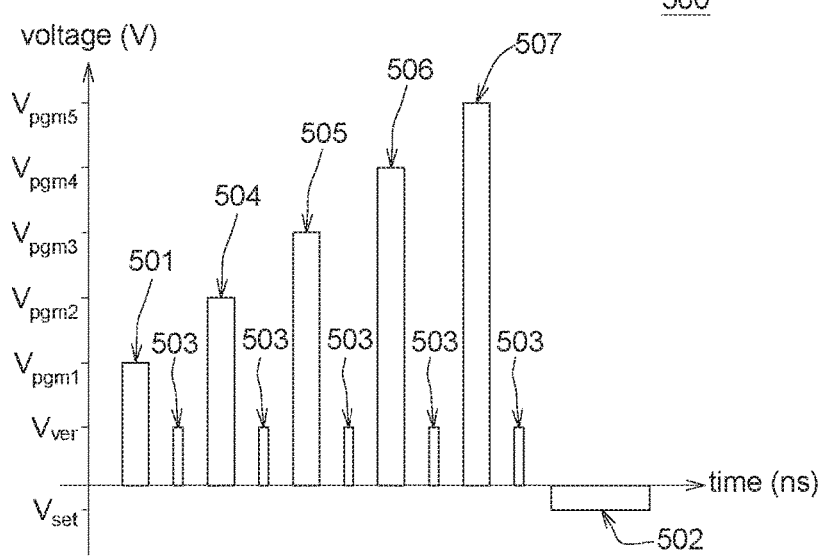
FIG. 5B is a timing diagram of a program process using the method depicted in FIG. 5A in accordance with one embodiment of the present disclosure.

FIG. 5A is a process flow diagram illustrating a method for operating the NVM device 100 in accordance with one embodiment of the present disclosure. FIG. 5B is a timing diagram of a program process 500 using the method depicted in FIG. 5A in accordance with one embodiment of the present disclosure. In some embodiments of the present disclosure, the program process 500 of the NVM device 100 includes steps as follows: Firstly, an NVM device, such as the NVM device 100 depicted in FIG. 1, is provided (see step S51).

A programming pulse 501 with a first polarity is then applied to at least one resistance switching memory cell 101 of the NVM device 100 (see step S52). For example, in the present embodiment, the programming pulse 501 may have a positive programming voltage $V_{pgm1}$ at about 1.6 V and a pulse width ranging from 500 ns to 3000 ns.

Next, a verifying pulse 503 having a verifying voltage $V_{ver}$ is applied to the resistance switching memory cell 101 (see step S53), to determine whether the resistance of the resistance switching memory cell 101 reaches a predetermined level. In the present embodiment, the verifying pulse 503 has a positive verifying voltage $V_{ver}$ (e.g. about 0.5 V) substantially less than the programming voltage $V_{pgm1}$ of the programming pulse 501 and a pulse width ranging from 50 ns to 100 ns.

During the verification in the step S53, when it is determined that the resistance of the resistance switching memory cell 101 reaches a predetermined level (designated as "YES"), the program process 500 proceeds to a step S54 in which a settling pulse 502 is applied to the resistance switching memory cell 101; and thereafter the program process 500 is terminated. In the present embodiment, the settling pulse 502 has a negative settling voltage $V_{set}$ about −0.5V and a pulse width about 1 μs.

Alternatively, when it is determined that the resistance switching memory cell 101 does not reach the predetermined level (designated as "NO"), the program process 500 proceed to the step S55 in which another programming pulse (such as a programming pulse 504) is applied to the resistance switching memory cell 101. In the present embodiment, the programming pulse 504 has a programming voltage $V_{pgm2}$ substantially greater than the programming voltage $V_{pgm1}$ of the programming pulse 501. Thereafter, the steps S53 is performed again to apply the verifying pulse 503 to the resistance switching memory cell 101; and the loop of the step S55 and S53 may not be stopped until the resistance switching memory cell 101 reaches the predetermined level. While it is determined that the resistance switching memory cell 101 reaches the predetermined level, a settling pulse 502 is applied to the resistance switching memory cell 101 (see step S54); and thereafter the program process 500 is terminated.

In the present embodiment, the loop of the steps S55 and S53 is repeated 4 times after the resistance switching memory cell 101 is subjected to the verifying pulse 503 for the first time. Such that, the resistance switching memory cell 101 is subjected to five programming pulses 501, 504, 505, 506 and 507, one settling pulse 502, and five verifying pulses 503 (see FIG. 5B). The program voltages $V_{pgm2}$, $V_{pgm3}$, $V_{pgm4}$ and $V_{pgm5}$ of the programming pulse 504, 505, 506 and 507 provided by the step S55 are greater than the programming voltage $V_{pgm1}$ of the programming pulse 501. The program voltages $V_{pgm1}$, $V_{pgm2}$, $V_{pgm3}$, $V_{pgm4}$ and $V_{pgm5}$ are sequentially increased.

Figure 6A:
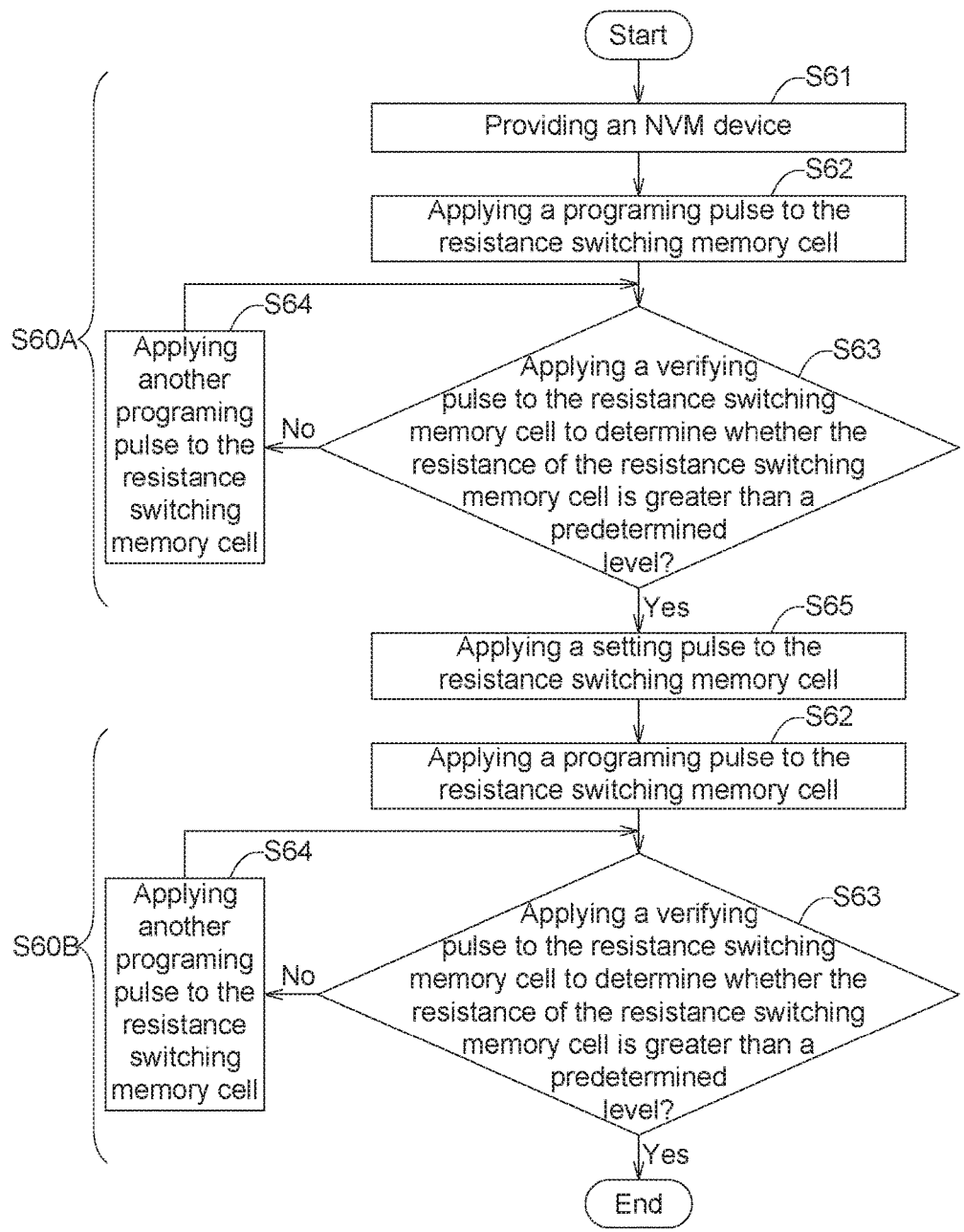
FIG. 6A is a process flow diagram illustrating a method for operating the NVM device in accordance with one embodiment of the present disclosure.
Figure 6B:
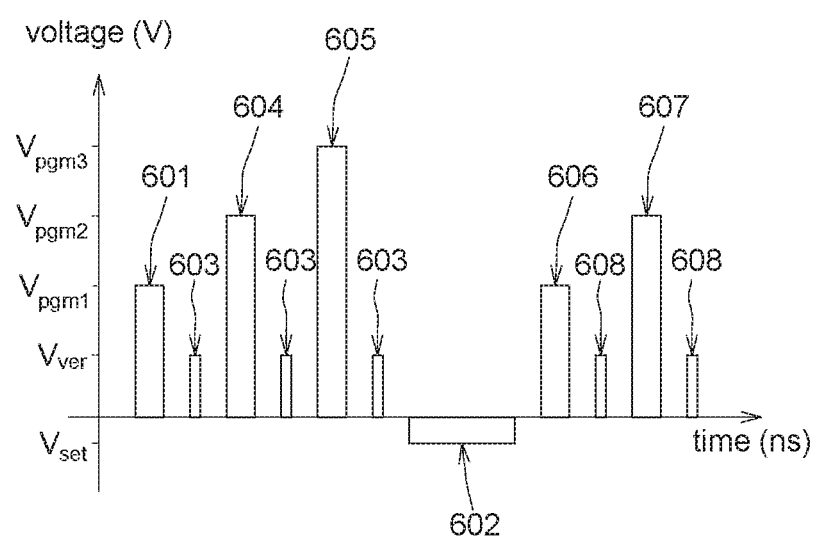
FIG. 6B is a timing diagram of a program process using the method depicted in FIG. 6A in accordance with one embodiment of the present disclosure.

FIG. 6A is a process flow diagram illustrating a method for operating the NVM device 100 in accordance with one embodiment of the present disclosure. FIG. 6B is a timing diagram of a program process 600 using the method depicted in FIG. 6A in accordance with one embodiment of the present disclosure. In some embodiments of the present disclosure, the program process 600 of the NVM device 100 includes steps as follows: Firstly, an NVM device, such as the NVM device 100 depicted in FIG. 1, is provided (see step S61). Next, a front-end program process S60A is performed on the resistance switching memory cell 101. A settling pulse 602 is then applied to the resistance switching memory cell 101 (see the step S65). A back-end program process S60B is subsequently performed on the resistance switching memory cell 101.

The front-end program process S60A includes steps as follows: A programming pulse 601 with a first polarity is then applied to at least one resistance switching memory cell 101 of the NVM device 100 (see step S62). Next, a verifying pulse 603 having a verifying voltage $V_{ver}$ is applied to the resistance switching memory cell 101 (see step S63), to determine whether the resistance of the resistance switching memory cell 101 is greater than a predetermined level.

In the present embodiment, the programming pulse 601 may have a positive programming voltage $V_{pgm1}$ about 1.6 V and a pulse width ranging from 500 ns to 3000 ns. The verifying pulse 603 has a positive verifying voltage $V_{ver}$ (e.g. about 0.5 V) substantially less than the programming voltage $V_{pgm1}$ of the programming pulse 601 and a pulse width ranging from 50 ns to 100 ns.

During the verification in the step S63, when it is determined that the resistance of the resistance switching memory cell 101 is not greater than a predetermined level (designated as "NO"), the program process 600 proceeds to a step S64 in which another programming pulse (such as a programming pulse 604) is applied to the resistance switching memory cell 101.

In the present embodiment, the programming pulse 604 has a programming voltage $V_{pgm2}$ substantially greater than the programming voltage $V_{pgm1}$ of the programming pulse 601. Thereafter, the steps S63 is performed again to apply the verifying pulse 603 to the resistance switching memory cell 101; and the loop of the step S64 and S63 may not be stooped until the resistance switching memory cell 101 reaches the predetermined level. While it is determined that the resistance switching memory cell 101 reaches the predetermined level, the front-end program process S60A is completed.

In the present embodiment, the loop of the steps S64 and S63 is repeated 2 times after the resistance switching memory cell 101 is subjected to the verifying pulse 603 for the first time. Such that, the resistance switching memory cell 101 is subjected to three programming pulses 601, 604, and 605 as well as three verifying pulses 603 (see FIG. 6B) in the front-end program process 560A. The program voltages $V_{pgm2}$ and $V_{pgm3}$ of the programming pulse 604 and 605 provided by the step S65 are greater than the programming voltage $V_{pgm1}$ of the programming pulse 601, and the program voltages $V_{pgm1}$, $V_{pgm2}$ and $V_{pgm3}$ are sequentially increased.

Thereinafter, the program process 600 proceeds to a step S65 in which a settling pulse 602 is applied to the resistance switching memory cell 101. The settling pulse 602 has the second polarity opposite to the first polarity; the settling voltage $V_{set}$ of the settling pulse 602 has an absolute value substantially less than or equal to that of the verifying voltage $V_{ver}$ ($|V_{set}| \leq |V_{ver}|$). The pulse width of the verifying pulse 603 is less than that of the settling pulse 602. In the present embodiment, the settling pulse 602 has a negative settling voltage $V_{set}$ about −0.5V and a pulse width about 1 μs.

The program process 600 is terminated after the back-end program process 560B is performed. In the present embodiment, the back-end program process 560B includes two programming pulses 606 and 607 as well as two verifying pulses 608. The programming pulses 606 and 607 have program voltages identical to the program voltages $V_{pgm1}$ and $V_{pgm2}$ of the programming pulses 601 and 604; and the verifying voltages of the verifying pulses 608 are identical to the verifying voltages $V_{ver}$ of the verifying pulse 603. Since the steps of the back-end program process 560B is identical to that of the front-end program process 560A, and thus the detailed steps for implementing the back-end program process 560B will not be redundantly described here.

Figure 7A:
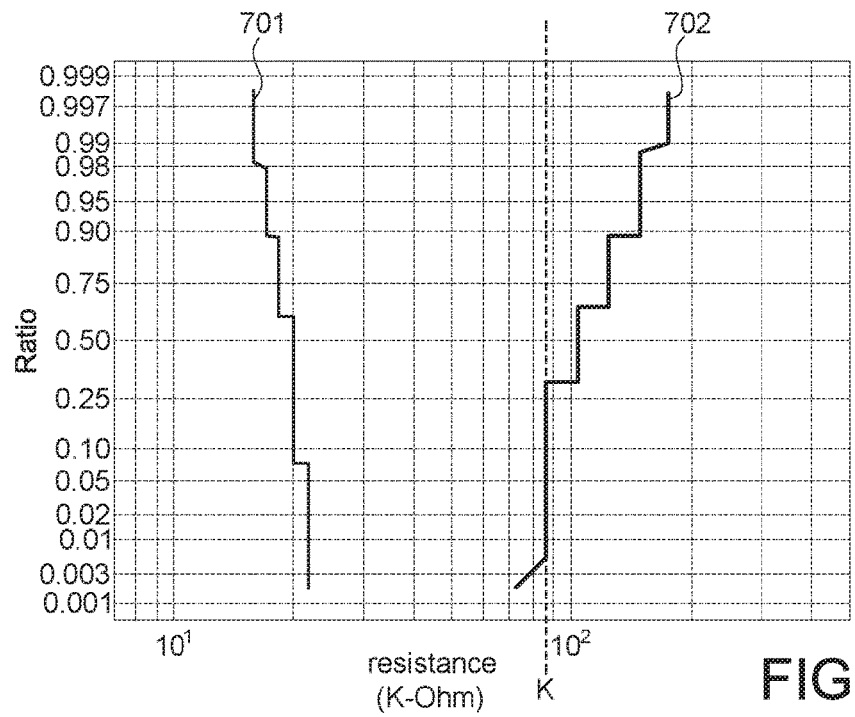
Figure 7B:
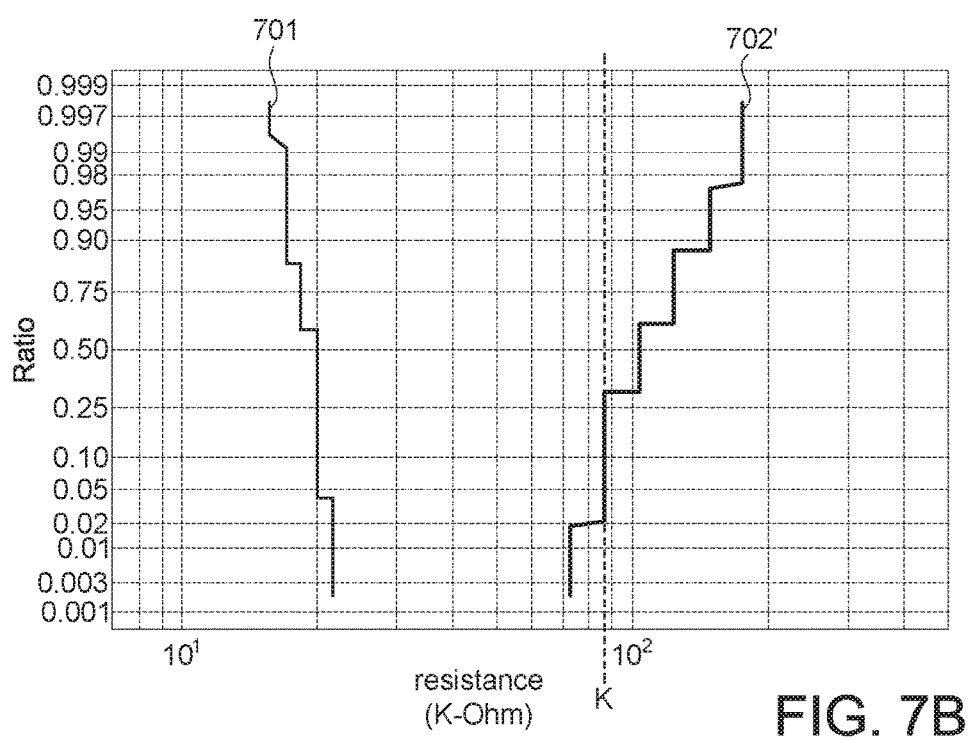

FIG. 7A is a diagram illustrating the resistance cumulative distribution function (CDF) of the resistance switching memory cells 101 of the operating the NVM device 100 on which the method and the program process 500 as depicted in FIG. 5A and FIG. 5B is performed, after the certain time interval pass by. FIG. 7B is a diagram illustrating the resistance CDF of the resistance switching memory cells 101 of the NVM device 100 on which a program process 500' provided by a comparison example is performed, after the certain time interval pass by. The program process 500 of the present embodiment is similar to the program process 500' of the comparison example, except that the program process of the comparison example omits the step S54 for applying the settling pulse 502 to the resistance switching memory cells 101.

According to FIG. 7A and FIG. 7B, after the program processes 500 and 500' are performed, the resistance distribution state of the resistance switching memory cells 101 can respectively shift from a first resistance distribution state (designated by the resistance CDF curve 701) to a second resistance distribution state (designated by the resistance CDF curve 702 and 702'), and the resistance of the resistance switching memory cells 101 can be greater than a predetermined level K (such as 87 K-ohm). However, after a certain time interval (e.g. after 1 second) pass by, most of the resistance of the resistance switching memory cells 101 may retain to be greater than the predetermined level K, but some of them may revert back to a broader distribution with an undesirable tail of which the resistance is less than the predetermined level K.

In the present embodiment, after the certain time interval pass by, less than one percent (such as, about 0.6%) of the resistance switching memory cells 101 that are subjected to the program processes 500 (as depicted in FIG. 5A and FIG. 5B) has a reverted back resistance less than the predetermined level K (see FIG. 7A); and about 2% of the resistance switching memory cells 101 that are subjected to the program processes of the comparison example has a reverted back resistance less than the predetermined level K (see FIG. 7B). It can be determined that using the method for operating the NVM device 100 as depicted in FIG. 5A and FIG. 5B can moderate the intrinsic program instability of the NVM device 100, so as to enhance the performance thereof.

Figure 8A:
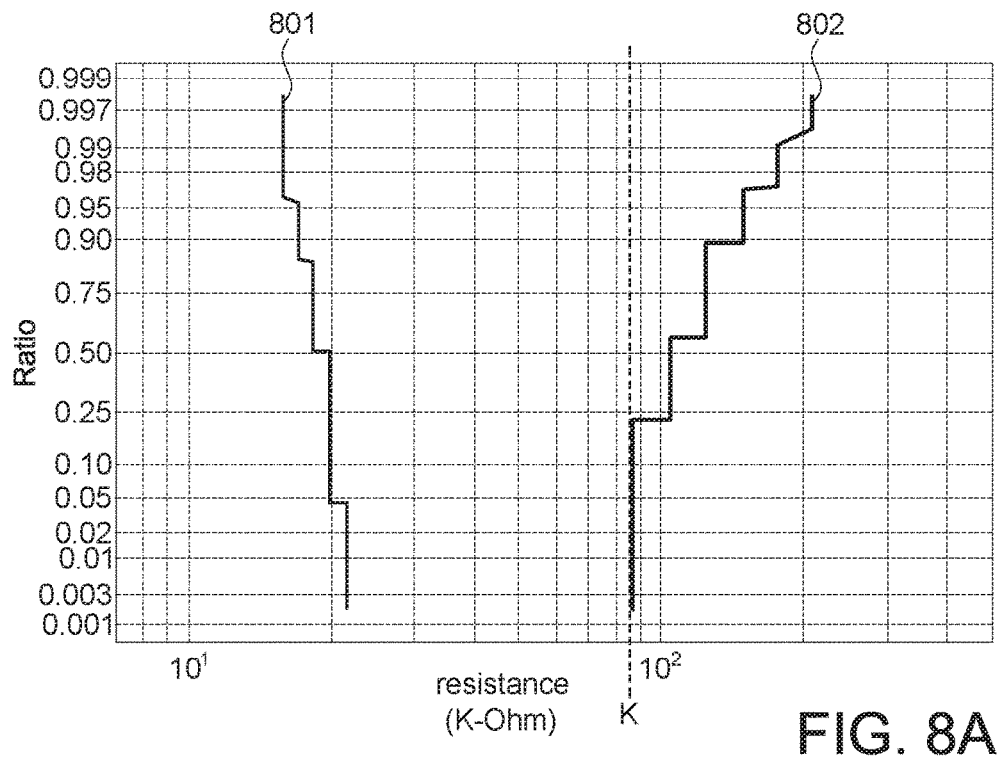
Figure 8B:
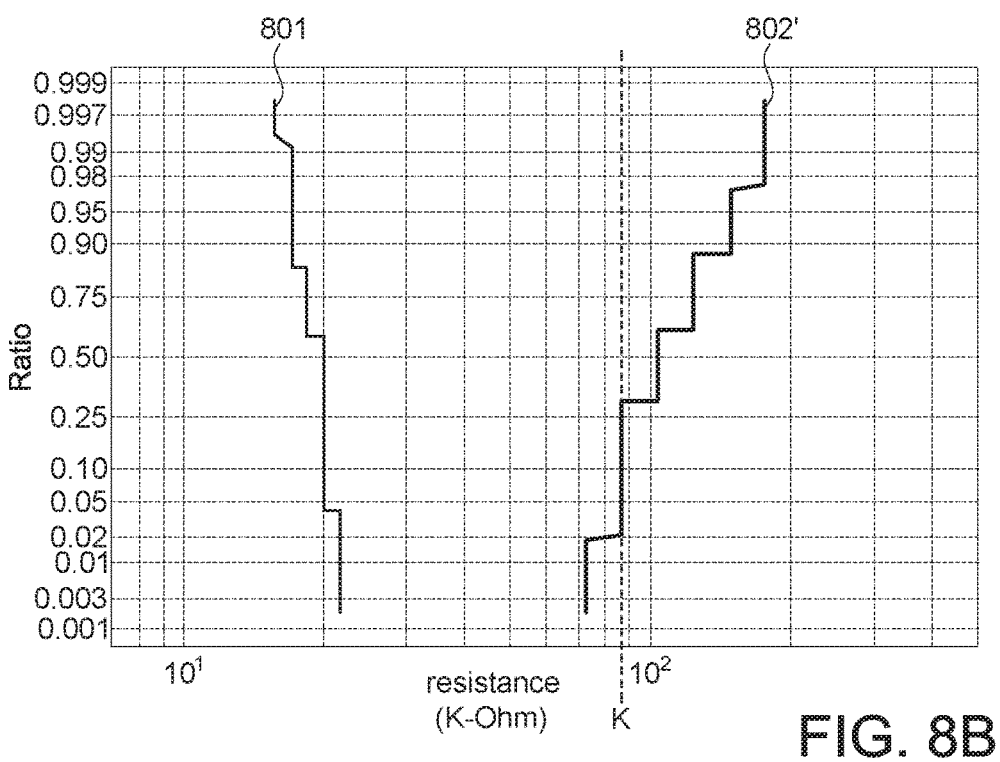

FIG. 8A is a diagram illustrating the resistance CDF of the resistance switching memory cells 101 of the NVM device 100 on which the method and the program process 600 as depicted in FIG. 6A and FIG. 6B is performed, after the certain time interval pass by. FIG. 8B is a diagram illustrating the resistance CDF of the resistance switching memory cells 101 of the NVM device 100 on which a program process provided by another comparison example is performed, after the certain time interval pass by.

The program process 600 of the present embodiment is similar to the program process of the comparison example, except that the program process of the comparison example omits the step S65 for applying the settling pulse 602 to the resistance switching memory cells 101.

According to FIG. 8A and FIG. 8B, after the program processes 600 of the present embodiment and the program process of the comparison example are performed, the resistance distribution state of the resistance switching memory cells 101 can respectively shift from a first resistance distribution state (designated by the resistance CDF curve 801) to a second resistance distribution state (designated by the resistance CDF curve 802 and 802'), and the resistance of the resistance switching memory cells 101 can be greater than a predetermined level K (such as 87 K-ohm). However, after a certain time interval (e.g. after 1 second) pass by, most of the resistance of the resistance switching memory cells 101 can still retain to be greater than the predetermined level K, but some of them are revert back to a broader distribution with an undesirable tail of which the resistance is less than the predetermined level K.

In the present embodiment, after the certain time interval pass by, all of the resistance switching memory cells 101 that are subjected to the program processes 600 (as depicted in FIG. 6A and FIG. 6B) has a reverted back resistance greater than a predetermined level K (see FIG. 8A); and about 2% of the resistance switching memory cells 101 that are subjected to the program processes (applying the method of the comparison example) has a reverted back resistance less than a predetermined level K (see FIG. 8B). It can be determined that using the method for operating the NVM device 100 as depicted in FIG. 6A and FIG. 6B can moderate the intrinsic program instability of the NVM device 100, so as to enhance the performance thereof.

Figure 9A:
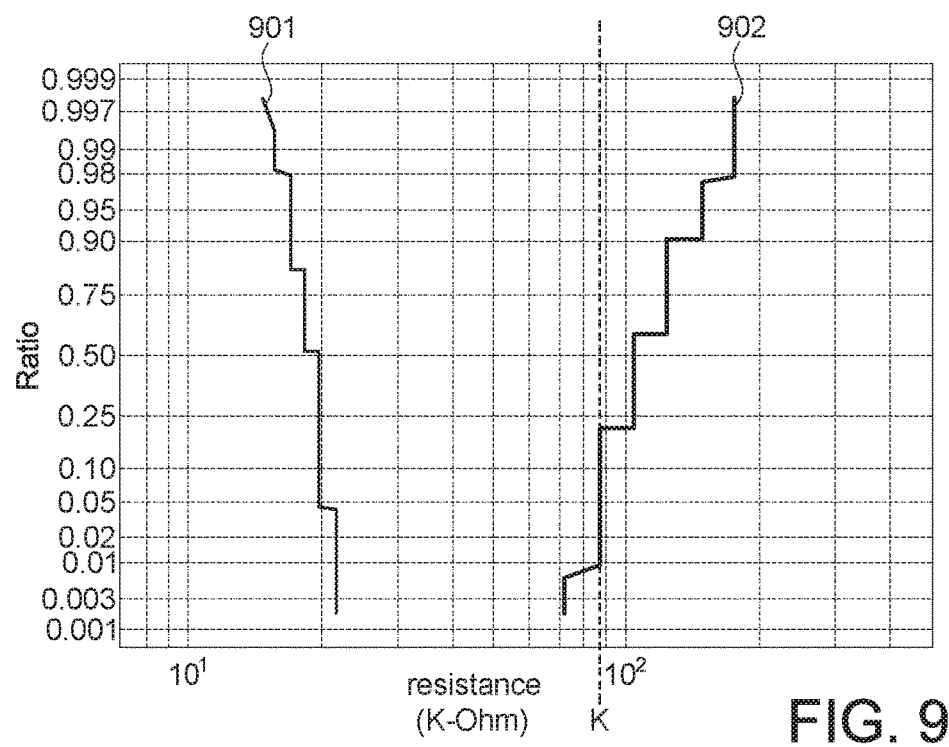
FIGS. 9A to 9D are diagrams illustrating the resistance CDF of the resistance switching memory cell of the NVM device on which the method and the program process as depicted in FIG. 5A and FIG. 5B, are performed, after the certain time interval pass by, wherein different magnitudes of the settling voltage $V_{set}$, such as −0.3V, −0.5V, −0.7V and −1.0V are applied to the NVM device respectively.
Figure 9B:
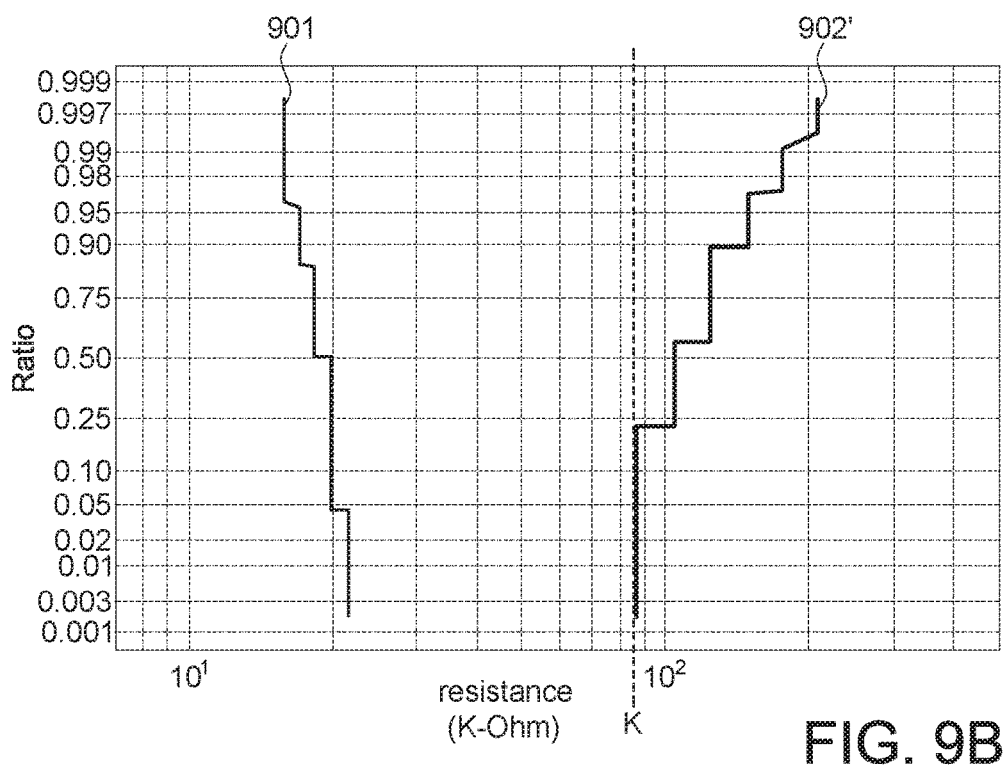
Figure 9C:
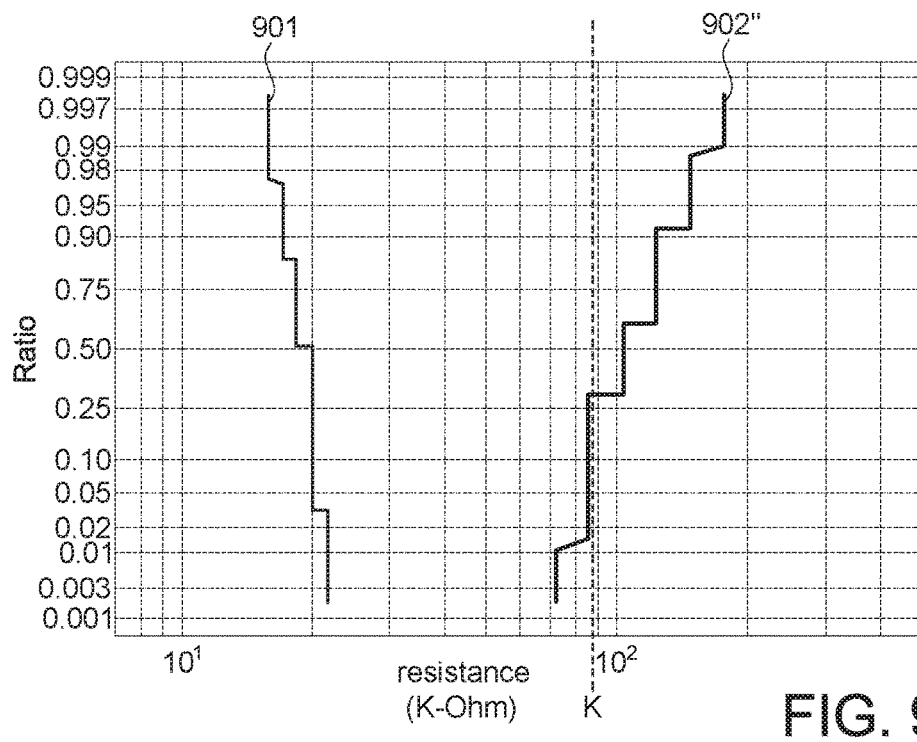
Figure 9D:
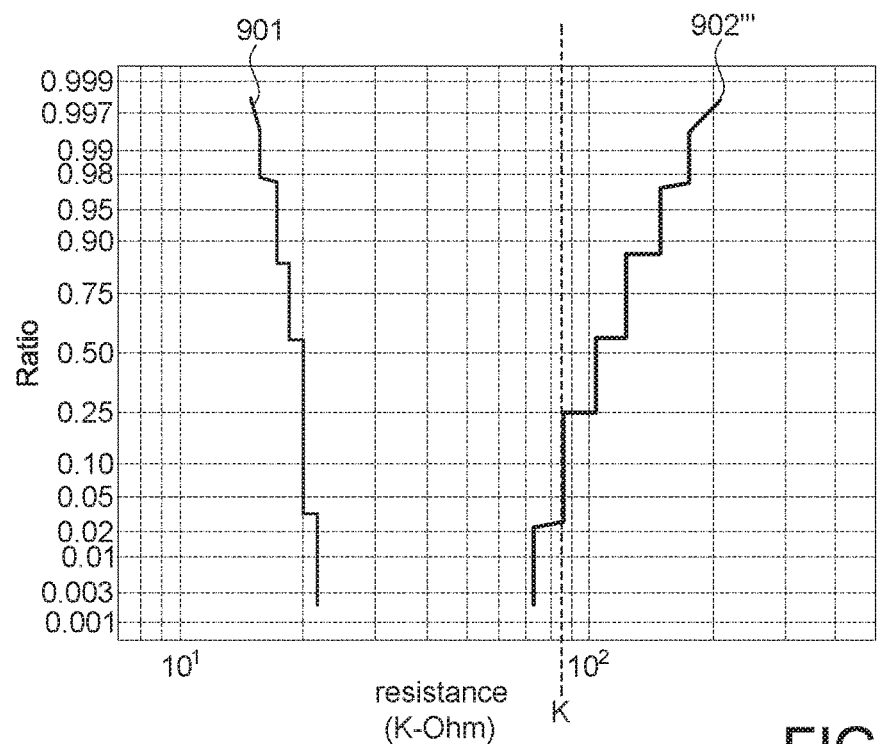

It should appreciated that the magnitude of the settling voltage $V_{set}$ plays an important role for moderating the intrinsic program instability of the resistance switching memory cell during the program processes of the NVM device 100. For example, FIGS. 9A to 9C are diagrams illustrating the resistance CDF of the resistance switching memory cells 101 of the NVM device 100 on which the method and the program process 500 as depicted in FIG. 5A and FIG. 5B, are performed, after the certain time interval pass by, wherein different magnitudes of the settling voltage $V_{set}$, such as −0.3V, −0.5V, −0.7V and −1.0V are applied to the NVM device 100 respectively.

In accordance with FIGS. 9A to 9D, after the program processes 500 are performed, the resistance distribution state of the resistance switching memory cells 101 can respectively shift from a first resistance distribution state (designated by the resistance CDF curve 901) to a second resistance distribution state (designated by the resistance CDF curve 902, 902', 902'' and 902'''), and the resistance of the resistance switching memory cells 101 can be greater than a predetermined level K (such as 87 K-ohm). The ratio of the resistance switching memory cells 101 that are subjected to the program processes 500 (as depicted in FIG. 5A and FIG. 5B) with different magnitudes of the settling voltage $V_{set}$, −0.3V, −0.5V, −0.7V and −1.0V, and still have a resistance reverted back to be less than a predetermined level K, after the certain time interval pass by, are about 0.7%, 0%, 1% and 2%. It is determined that the performance of the program processes 500 using the settling voltage $V_{set}$, of −0.5V to moderating the intrinsic program instability of the NVM device 100 (see FIG. 9B) is better than the program processes 500 using the settling voltage $V_{set}$, of −0.3V (see FIG. 9A), and the performance of the program processes 500 using the settling voltage $V_{set}$, of −0.3V to moderating the intrinsic program instability of the NVM device 100 is better than the program processes 500 using the settling voltages $V_{set}$, of −0.7V and −1.0V (see FIG. 9C and FIG. 9D).

In accordance with the aforementioned embodiments of the present disclosure, a method for operating an NVM device and the application thereof are provided. A programming pulse and a verifying pulse are applied to at least one resistance switching memory cell of the NVM device during a program process of the NVM device, and a settling pulse is applied to the resistance switching memory cell before or after applying the verifying pulse, wherein the settling pulse and the verifying pulse have opposite polarities; and the settling pulse has a settling voltage with an absolute value substantially less than the voltage of the verifying pulse. The resistance of the resistance switching memory cell can be greater than a predetermined level after the program process, and the resistance distribution state of the resistance switching memory cell may not revert back to a broader distribution with an undesirable tail of which the resistance is less than the predetermined level after a time interval pass by. Such that, the problems resulted from the intrinsic program instability of the resistance switching memory cell can be moderated.

While the disclosure has been described by way of example and in terms of the preferred embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for operating a non-volatile memory (NVM) device comprising:
   performing a first program process, wherein the first program process comprises:
   applying a first programming pulse having a first polarity to at least one resistance switching memory cell of the NVM device;
   applying a first verifying pulse with a verifying voltage ($V_{ver}$) to the resistance switching memory cell;
   applying a second programming pulse having the first polarity to the resistance switching memory cell;
   applying a second verifying pulse to the resistance switching memory cell, wherein the resistance switching memory cell has a resistance substantially greater than a predetermined level after the second verifying pulse is applied thereto; and
   applying a first settling pulse to the resistance switching memory cell, wherein the first settling pulse comprises a settling voltage ($V_{set}$) having a second polarity opposite to the first polarity and an absolute value substantially less than or equal to that of the verifying voltage ($|V_{set}| \leq |V_{ver}|$); and the resistance is not less than the predetermined level after a time interval pass by.

2. The method according to claim 1, wherein the verifying voltage has the first polarity or the second polarity.

3. The method according to claim 1, wherein the first verifying pulse has the second polarity; and the first verifying pulse and the first settling pulse are integrated with each other to form a zigzag-shaped integrated pulse.

4. The method according to claim 1, further comprising a second settling pulse is applied to the resistance switching memory cell after the second verifying pulse and the second programming pulse being applied to the resistance switching memory cell.

5. The method according to claim 1, further comprising a second program process after the first program process is performed, wherein the second program process comprises:
   applying a third programming pulse having the first polarity to the resistance switching memory cell; and
   applying a third verifying pulse with the verifying voltage to the resistance switching memory cell.

6. The method according to claim 1, wherein the first settling pulse has a pulse width substantially greater than that of the first verifying pulse.

7. The method according to claim 6, wherein the pulse width of the first settling pulse is about 1 microsecond (μs); and the first verifying pulse has a pulse width substantially ranging from 50 nanoseconds (ns) to 100 ns.

8. A NVM device comprising:
   at least one resistance switching memory cell; and
   a controller electrically connecting the resistance switching memory cell and used to perform a first program process, wherein the first program process comprises steps as follows:
   applying a first programming pulse having a first polarity to the NVM device;
   applying a first verifying pulse with a verifying voltage ($V_{ver}$) to the resistance switching memory cell;
   applying a second programming pulse having the first polarity to the resistance switching memory cell;
   applying a second verifying pulse to the resistance switching memory cell, wherein the resistance switching memory cell has a resistance substantially greater than a predetermined level after the second verifying pulse is applied thereto; and
   applying a first settling pulse to the resistance switching memory cell, wherein the first settling pulse comprises a settling voltage ($V_{set}$) having a second polarity opposite to the first polarity and an absolute value substantially less than or equal to that of the verifying voltage ($|V_{set}| \leq |V_{ver}|$); and the resistance is not less than the predetermined level after a time interval pass by.

9. The NVM device according to claim 8, wherein the verifying voltage has the first polarity or the second polarity.

10. The NVM device according to claim 8, wherein the first settling pulse has a pulse width substantially greater than that of the first verifying pulse.

11. A method for fabricating a NVM device, comprising:
   forming at least one resistance switching memory cell; and forming a controller electrically connecting the resistance switching memory cell and used to perform a first program process, wherein the first program process comprises steps as follows:

applying a first programming pulse having a first polarity to the NVM device;

applying a first verifying pulse with a verifying voltage ($V_{ver}$) to the resistance switching memory cell;

applying a second programming pulse having the first polarity to the resistance switching memory cell;

applying a second verifying pulse to the resistance switching memory cell, wherein the resistance switching memory cell has a resistance substantially greater than a predetermined level after the second verifying pulse is applied thereto; and applying a first settling pulse to the resistance switching memory cell, wherein the first settling pulse comprises a settling voltage ($V_{set}$) having a second polarity opposite to the first polarity and an absolute value substantially less than or equal to that of the verifying voltage ($|V_{set}| \leq |V_{ver}|$); and the resistance is not less than the predetermined level after a time interval pass by.

12. The method according to claim 11, wherein the verifying voltage has the first polarity or the second polarity.

13. The method according to claim 11, wherein the first settling pulse has a pulse width substantially greater than that of the first verifying pulse.

* * * * *